United States Patent
Shibayama

(10) Patent No.: US 6,853,046 B2
(45) Date of Patent: Feb. 8, 2005

(54) PHOTODIODE ARRAY AND METHOD OF MAKING THE SAME

(75) Inventor: Katsumi Shibayama, Hamamatsu (JP)

(73) Assignee: Hamamatsu Photonics, K.K., Shizouka (JP)

( * ) Notice: Subject to any disclaimer, the term of this patent is extended or adjusted under 35 U.S.C. 154(b) by 0 days.

(21) Appl. No.: 10/668,605

(22) Filed: Sep. 24, 2003

(65) Prior Publication Data
US 2004/0129992 A1 Jul. 8, 2004

Related U.S. Application Data
(60) Provisional application No. 60/430,674, filed on Dec. 4, 2002.

(30) Foreign Application Priority Data
Sep. 24, 2002 (JP) .................... P2002-277948

(51) Int. Cl.⁷ ............................. H01L 31/00; G01J 1/24
(52) U.S. Cl. .................. 257/466; 257/443; 257/447; 257/461; 257/464; 250/370.14
(58) Field of Search ................. 257/443, 466, 257/447, 461, 464; 250/370.14

(56) References Cited

U.S. PATENT DOCUMENTS

| | | | |
|---|---|---|---|
| 3,725,751 A | * | 4/1973 | Wakamiya ............... 257/443 |
| 3,886,587 A | * | 5/1975 | Nicolay .................. 257/443 |
| 4,200,472 A | * | 4/1980 | Chappell et al. .......... 136/246 |
| 4,477,721 A | * | 10/1984 | Chappell et al. .......... 257/82 |
| 5,122,669 A | * | 6/1992 | Herring et al. .......... 250/370.14 |
| 5,446,308 A | * | 8/1995 | Piccone et al. .......... 257/438 |
| 5,536,964 A | * | 7/1996 | Green et al. ............ 257/432 |
| 6,404,031 B1 | * | 6/2002 | Hane et al. ............. 257/466 |

FOREIGN PATENT DOCUMENTS

| | | |
|---|---|---|
| JP | 02-039569 | 2/1990 |
| JP | 05-029483 | 2/1993 |
| JP | 06-177201 | 6/1994 |

* cited by examiner

Primary Examiner—Eddie Lee
Assistant Examiner—Samuel A Gebremariam
(74) Attorney, Agent, or Firm—Morgan, Lewis & Bockius LLP

(57) ABSTRACT

A photodiode array comprises a semiconductor substrate formed with an array of a plurality of pn junction type photodiodes on a light incident surface side, the surface opposite from the incident surface in the semiconductor substrate being made of a (100) plane; a through hole, formed in an area held between the photodiodes, penetrating through the semiconductor substrate from the incident surface side to the opposite surface side; and a conductive layer extending from the incident surface to the opposite surface by way of a wall surface of the through hole; the through hole being formed by connecting a vertical hole part formed substantially perpendicular to the incident surface on the incident surface side, and a pyramidal hole part formed like a quadrangular pyramid on the opposite surface side to each other within the semiconductor substrate; the pyramidal hole part having a wall surface formed as a (111) plane.

2 Claims, 14 Drawing Sheets

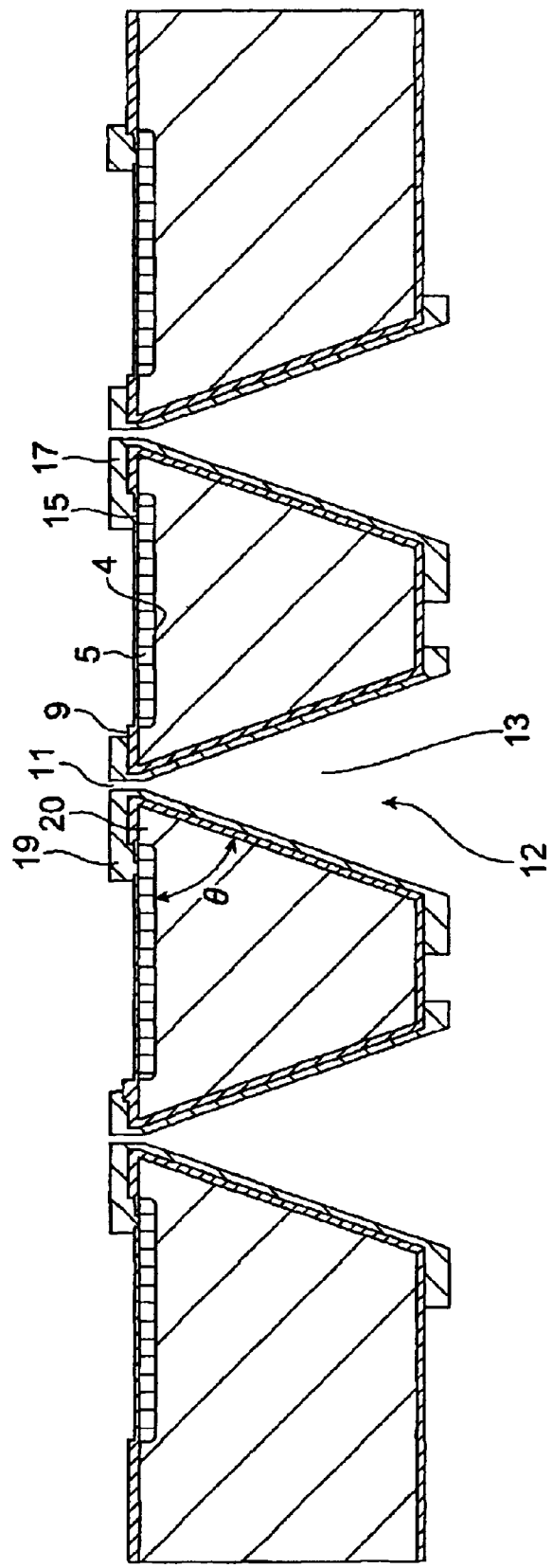

PHOTODIODE ARRAY AND METHOD OF MAKING THE SAME

CROSS-REFERENCE TO RELATED APPLICATION

This application claims priority to Provisional Application Ser. No. 60/430,674 filed on Dec. 4, 2002 which is hereby incorporated by reference in its entirety.

BACKGROUND OF THE INVENTION

1. Field of the Invention

The present invention relates to a photodiode array and a method of making the same.

2. Related Background Art

Photodiode arrays for CT (computed tomography) have been required to have a larger area. For eliminating insensible regions from a photodiode array, three-dimensional packaging is necessary, in which a signal processing unit is disposed on the opposite side (rear side) of the light incident surface. To this aim, it is necessary for an electrode formed on the incident side (front side) by using a through hole wiring to be drawn to the opposite side (rear side) of the incident surface.

Semiconductor devices using such a through hole wiring are disclosed, for example, in the following Patent Documents 1 and 2. In the semiconductor device disclosed in the Patent Document 1, a substrate is etched by wet etching with an alkali solution in order to form a through hole, whereby the revealed plane of substrate is at an angle of 54.7° with respect to the substrate surface.

Patent Document 1: Japanese Patent Application Laid-Open No. HEI 5-29483

Patent Document 2: Japanese Patent Application Laid-Open No. HEI 6-177201

SUMMARY OF THE INVENTION

When forming an electrode of each of photodiodes in a photodiode array by using the technique mentioned above, however, the through hole gradually increases its width from the front side to the rear side. Therefore, the photodiodes cannot be formed so close to each other, whereby the filler is limited.

FIG. 14 is a sectional view of a photodiode array in the prior art.

As shown in FIG. 14, the angle θ formed between the surface on the front side of the substrate and the inner wall surface of the through hole becomes acute if the above-mentioned etching is used alone. Therefore, if the corner 20 defining this acute angle is covered with a through hole wiring 17, conduction is likely to fail at the part of corner 20 because of insufficient coverage with the wiring.

Though dry etching may be used for forming a through hole perpendicular to the substrate surface, it is practically impossible to form a through hole with a uniform diameter in a substrate having a thickness of 250 to 400 μm. Also, since the processing rate of dry etching is low, it takes a long processing time to penetrate through the substrate having a thickness of 250 to 400 μm.

Hence, it is an object of the present invention to overcome the problem mentioned above and provide a photodiode array which is less likely to cause conduction failures in through hole wirings, while yielding a large fill factor.

For overcoming the above-mentioned problem, the present invention provides a photodiode array comprising a semiconductor substrate of a first conduction type formed with an array of a plurality of pn junction type photodiodes on an incident surface side for light to be detected, the surface opposite from the incident surface in the semiconductor substrate being made of a (100) plane; the semiconductor substrate having a through hole, formed in an area held between the photodiodes, penetrating through the semiconductor substrate from the incident surface side to the opposite surface side; the photodiode array comprising a conductive layer extending from the incident surface to the opposite surface by way of a wall surface of the through hole; the through hole comprising a vertical hole part formed substantially perpendicular to the incident surface on the incident surface side, and a pyramidal hole part formed like a quadrangular pyramid on the opposite surface side, the vertical hole part and pyramidal hole part being connected to each other within the semiconductor substrate; the pyramidal hole part having a wall surface formed as a (111) plane.

Here, "substantially perpendicular" refers to the state of intersection within the angular range of 85° to 90°.

In this photodiode array, all the covering corners' angles of the conductive layer extending from the incident surface to the opposite surface by way of the wall surface of the through hole become 90° or greater, whereby conduction failures are less likely to occur because of insufficient coverage with the conductive layer. Also, even when the photodiodes are disposed close to each other, the fill factor can be increased.

The photodiode array in accordance with the present invention may further comprise a high impurity concentration layer of the first conduction type surrounding the through hole within the semiconductor substrate.

This photodiode array comprises the high impurity concentration layer surrounding the through hole, and thus can trap unnecessary carriers which may occur when the through hole is mechanically damaged, thereby suppressing leak currents and dark currents.

The present invention provides a method of making a photodiode array comprising the following steps:

A first step of preparing a semiconductor substrate having a first surface formed as a (100) plane, and forming a predetermined area of a second surface opposite from the first surface with an array of a plurality of pn junction type photodiodes.

A second step of forming a pyramidal depression having a quadrangular pyramid form with a depth smaller than a thickness of the semiconductor substrate from the first surface side of the semiconductor substrate by anisotropic etching for a plurality of photodiodes.

A third step of forming a vertical hole substantially perpendicular to the second surface by dry etching from the second surface side at a position corresponding to the pyramidal depression, and connecting the pyramidal depression to the vertical hole, so as to form a through hole penetrating through the semiconductor substrate from the second surface to the first surface.

A fourth step of forming a conductive layer extending from the second surface to the first surface by way of the through hole.

In this method, the vertical hole is formed after the pyramidal depression having a quadrangular pyramid form is formed. Thus formed pyramidal depression has a depth smaller than the thickness of the semiconductor substrate. As a consequence, etching solutions do not leak to the second surface side, and thus do not adversely affect the photodiodes on the second surface side.

BRIEF DESCRIPTION OF THE DRAWING

FIG. 14 is a sectional view of a photodiode array in the prior art.

DESCRIPTION OF THE PREFERRED EMBODIMENT

In the following, embodiments of the present invention will be explained. Here, constituents identical to each other will be referred to with numerals identical to each other without repeating overlapping descriptions.

Figure 1:
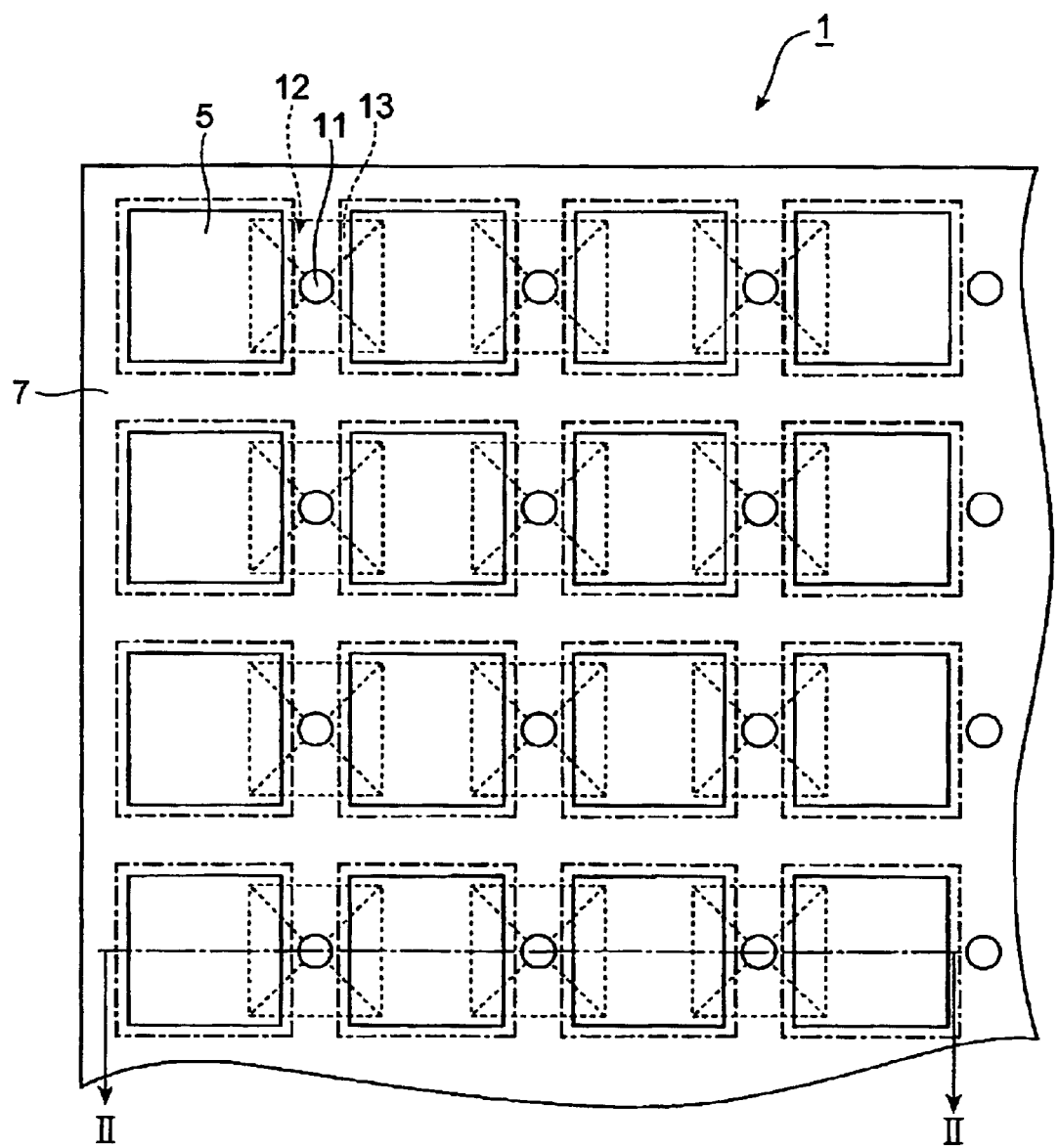
FIG. 1 is a plan view of the photodiode array in accordance with a first embodiment.
Figure 2:
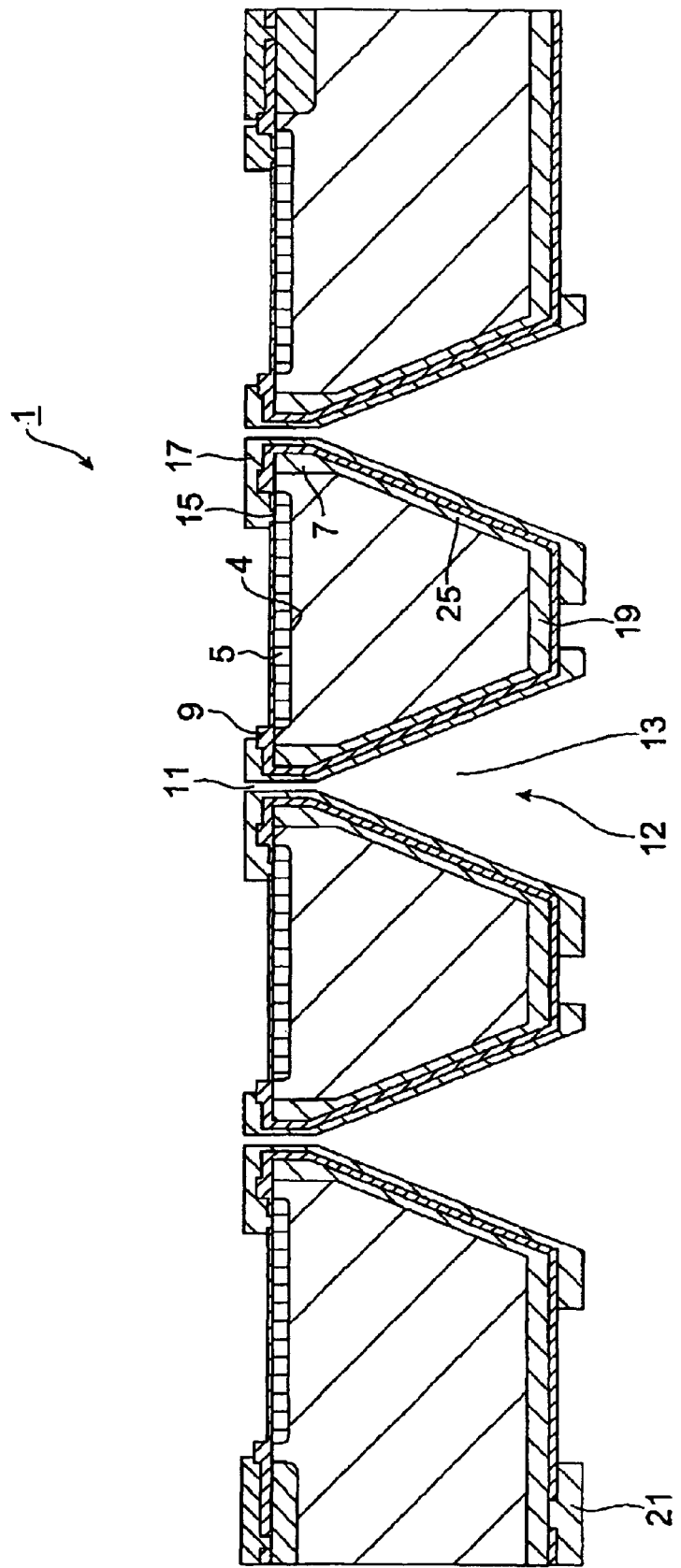
FIG. 2 is a sectional view of the photodiode array in accordance with the first embodiment.

FIG. 1 is a plan view enlarging a part of the photodiode array in accordance with a first embodiment, whereas FIG. 2 is a sectional view thereof.

In the following explanation, the surface on which light is incident will be referred to as front side, whereas the surface opposite therefrom will be referred to as rear side. In the photodiode array 1 of this embodiment, a plurality of pn junctions (photodiodes) 4 are regularly arranged in an array of a matrix on the front side, each pn junction functioning as a photo-sensitive pixel of the photodiode array 1.

The photodiode array 1 comprises an n-type silicon substrate 3 having a thickness of 270 µm and an impurity concentration of $1 \times 10^{12}$ to $10^{15}/cm^3$; and a plurality of p-type impurity diffusion layers 5 arranged with a pitch of about 1.5 mm, each having a size of 500 µm×500 µm, a depth of 0.5 to 1 µm in the substrate, and an impurity concentration of $1 \times 10^{13}$ to $10^{20}/cm^3$.

The photo-sensitive pixels are constituted by the pn junctions 4 formed between the n-type silicon substrate 3 and a plurality of p-type impurity diffusion layers 5. An $n^+$-type impurity area (separation layer) 7 for separating the photodiodes from each other and trapping unnecessary carriers so as to reduce dark currents is disposed between the p-type impurity diffusion layers 5. Then, there are $n^+$-electrodes 21 on the rear side.

A first hole part 11 (vertical hole part) and a second hole part 13 (pyramidal hole part) are formed on the front and rear sides, respectively, between the pn junctions 4 adjacent to each other.

Figure 3A:
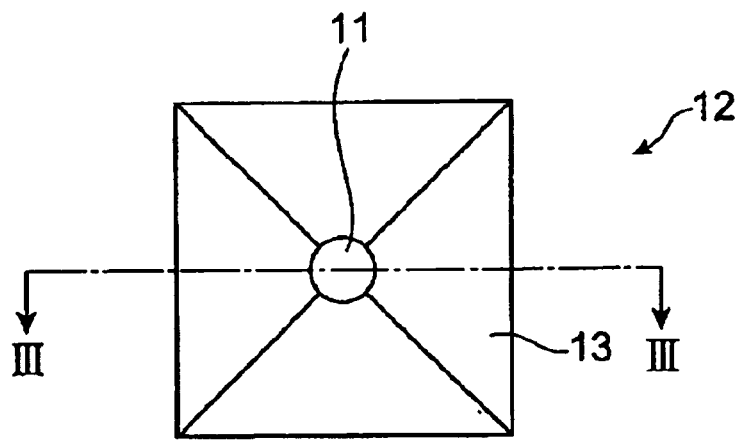
FIG. 3A is a plan view of a part formed with a through hole.
Figure 3B:
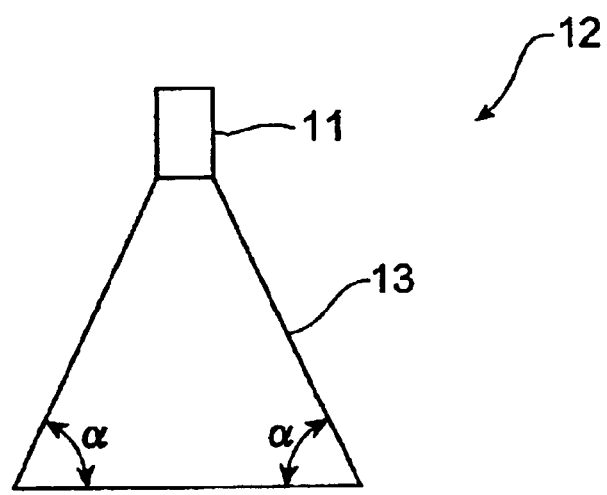
FIG. 3B is a vertical sectional view of the part formed with the through hole taken along the line III—III.
Figure 3C:
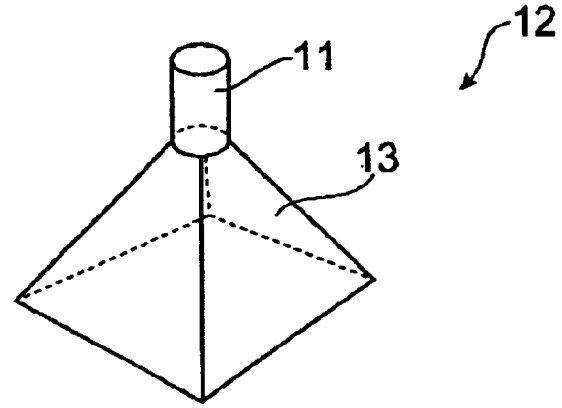
FIG. 3C is a perspective view of the part formed with the through hole.

FIG. 3A is a plan view of a part formed with a through hole. FIG. 3B is a sectional view of the part formed with the through hole taken along the line III—III. FIG. 3C is a perspective view of the part formed with the through hole.

A through hole 12 comprises the first hole part 11 and second hole part 13 connected to each other. The first hole part 11 is formed with a diameter of 10 µm on the front side of the substrate so as to be substantially parallel to the thickness direction of the substrate. The first hole part 11 is formed like a cylinder substantially parallel to the thickness direction of the substrate at a position penetrating through the separation layer 7. The hole is formed with a depth not smaller than the depth by which the p-type impurity diffusion layer 5 is formed. This prevents the second hole part 13 from limiting the depletion layers extending from the pn junctions 4, whereby the p-type impurity diffusion layers 5 can be arranged close to each other.

The second hole part 13 is formed like a quadrangular pyramid from the rear side of the substrate, with its width tapering down toward the front side. The second hole part 13 is formed by anisotropic etching from the rear side, whereby a (111) plane is exposed at the wall surface of the hole part, and the wall surface forms an angle of about 54.7° with respect to the surface of the photodiode array (angle $\alpha \approx 54.7°$ in FIG. 3B). Since the second hole part 13 is formed like a quadrangular pyramid, it is easier to provide the inner wall of the hole part with a conductive layer (through hole wiring).

The first hole part 11 and second hole part 13 are connected to each other within the substrate, so as to form a single through hole 12. The front and rear sides of the substrate, including the wall surface of the through hole 12 and the front side of the p-type impurity diffusion layers 5, are covered with a thermally oxidized layer 9 of silicon. Not only the thermally oxidized silicon layer but also an AR (AntiReflection) coat may be formed according to a required wavelength sensitivity of photodiodes. The AR coat may be a single layer of any of $SiO_2$ and $SiN_x$, or an insulator composite film or laminated film including them.

A through hole wiring 17 is formed by aluminum on the thermally oxidized layer 9, and is in contact with the p-type impurity diffusion layer 5 by way of a contact hole 15 formed in the thermally oxidized layer 9. Further, the through hole wiring 17 extends to the rear side by way of the wall surface of the through hole 12, so as to be able to come into electric contact with the p-type impurity diffusion layer 5 from the rear side. Here, there will be no problems even if the first hole part 11 is filled with the metal of the through hole wiring 17 so that the front and rear sides of the substrate are spatially separated from each other, since the electric contact between the p-type impurity diffusion layer 5 and the rear side will not be lost (see FIG. 4).

Figure 4:
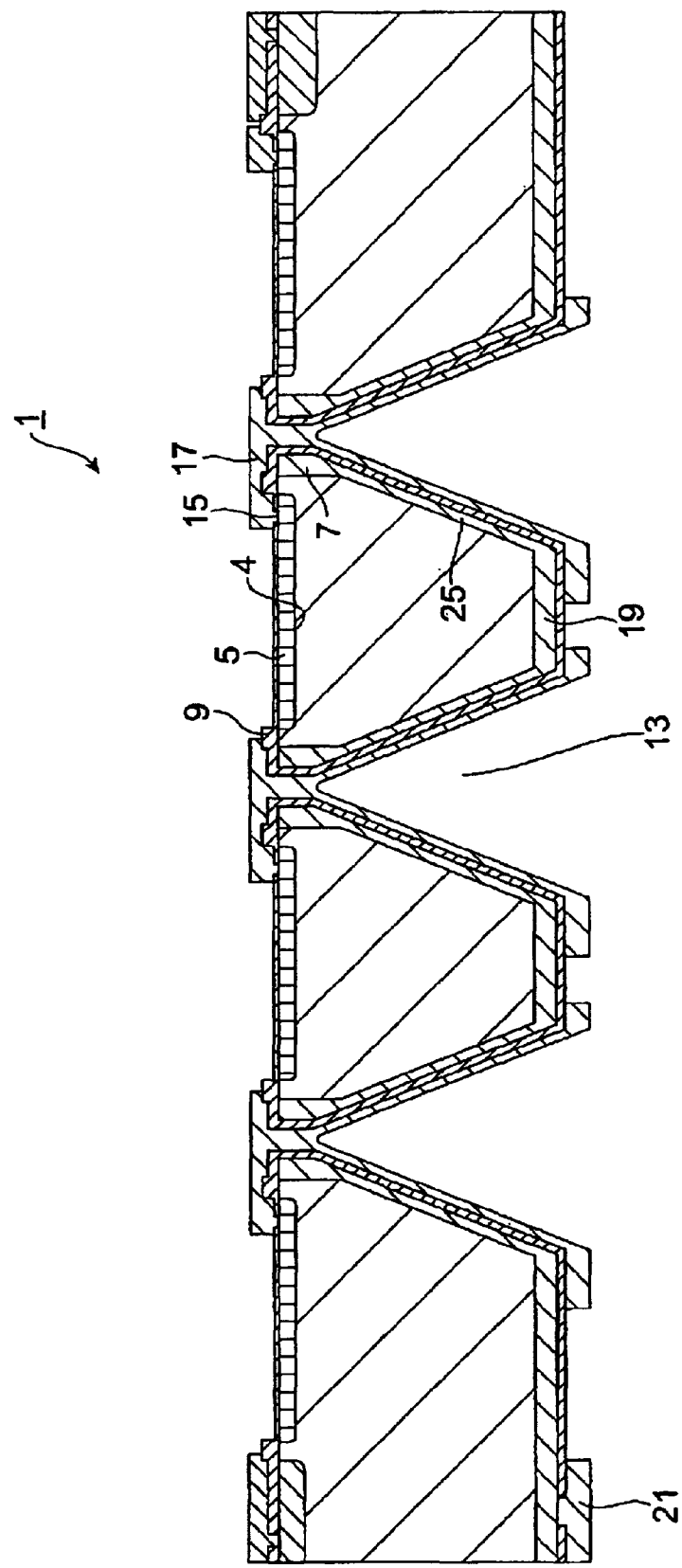
FIG. 4 is a sectional view of a photodiode array.

FIG. 4 is a sectional view of a photodiode array. Though the inside of the first hole part 11 is filled with the through hole wiring 17 in this photodiode array, the rear side of the photodiode array is in electric contact with the p-type impurity diffusion layer 5.

The material for the through hole wiring 17 is not limited to aluminum. Copper, nickel, gold, tungsten, titanium, polysilicon, and the like, or alloys or laminated metals including them may be used as well. In place of the thermally oxidized layer 9, an oxide film made by CVD may also be used. An oxide or nitride film made by CVD may also be disposed between the thermally oxidized layer 9 and through hole wiring 17. This can secure a high insulating property between the silicon substrate and the through hole wiring 17.

Figure 5:
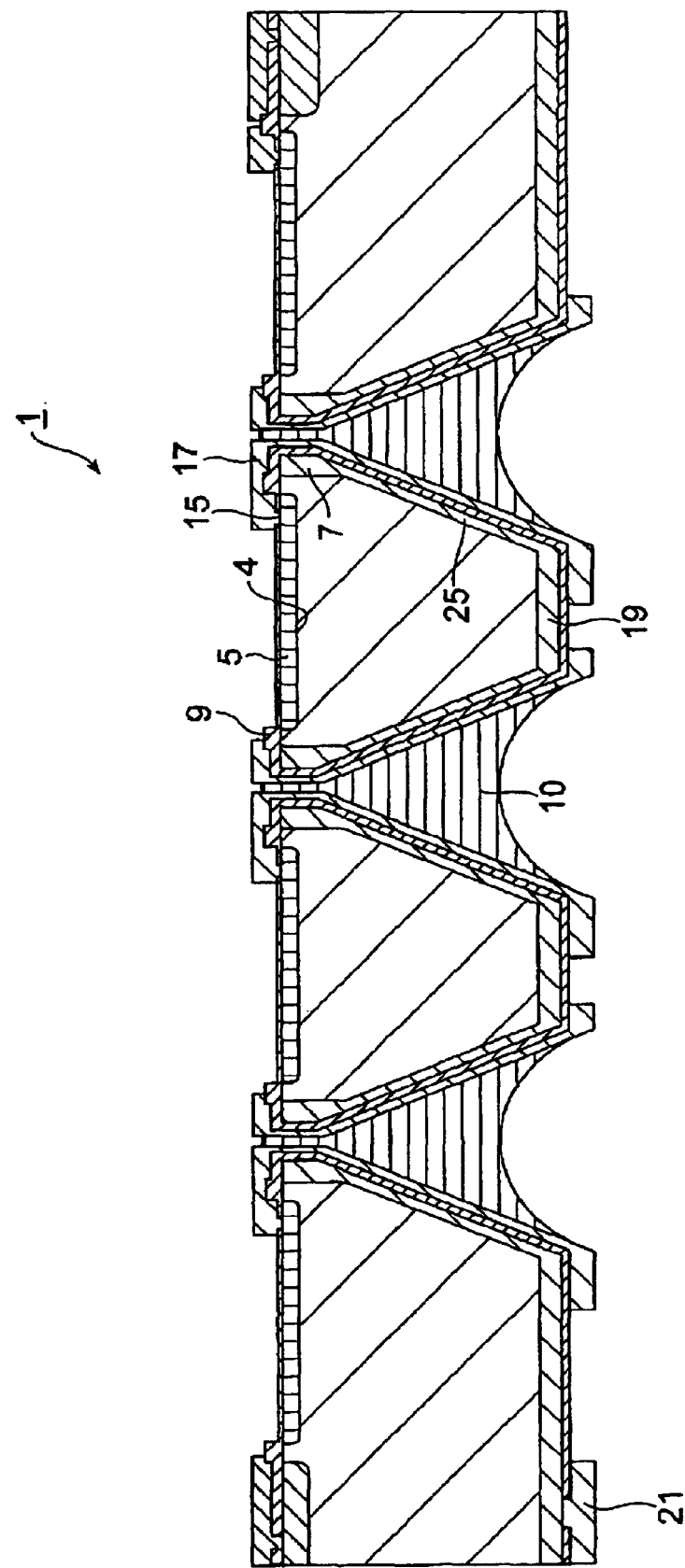
FIG. 5 is a sectional view of a photodiode array.

FIG. 5 is a sectional view of a photodiode array. In this photodiode array, the through hole 12 is filled with a filler material 10 such as a resin on the through hole wiring 17. Though the front and rear sides of the substrate are spatially separated from each other thereby, the mechanical strength of the photodiode array 1 can be improved without losing the electric contact between the p-type impurity diffusion layer 5 and the rear side.

Here, the material filling the through hole 12 may be resin type insulating materials including epoxy, polyimide, acrylic, silicone, and urethane resins, or electrically conductive resins including an electrically conductive filler in addition to these insulating materials.

Figure 6:
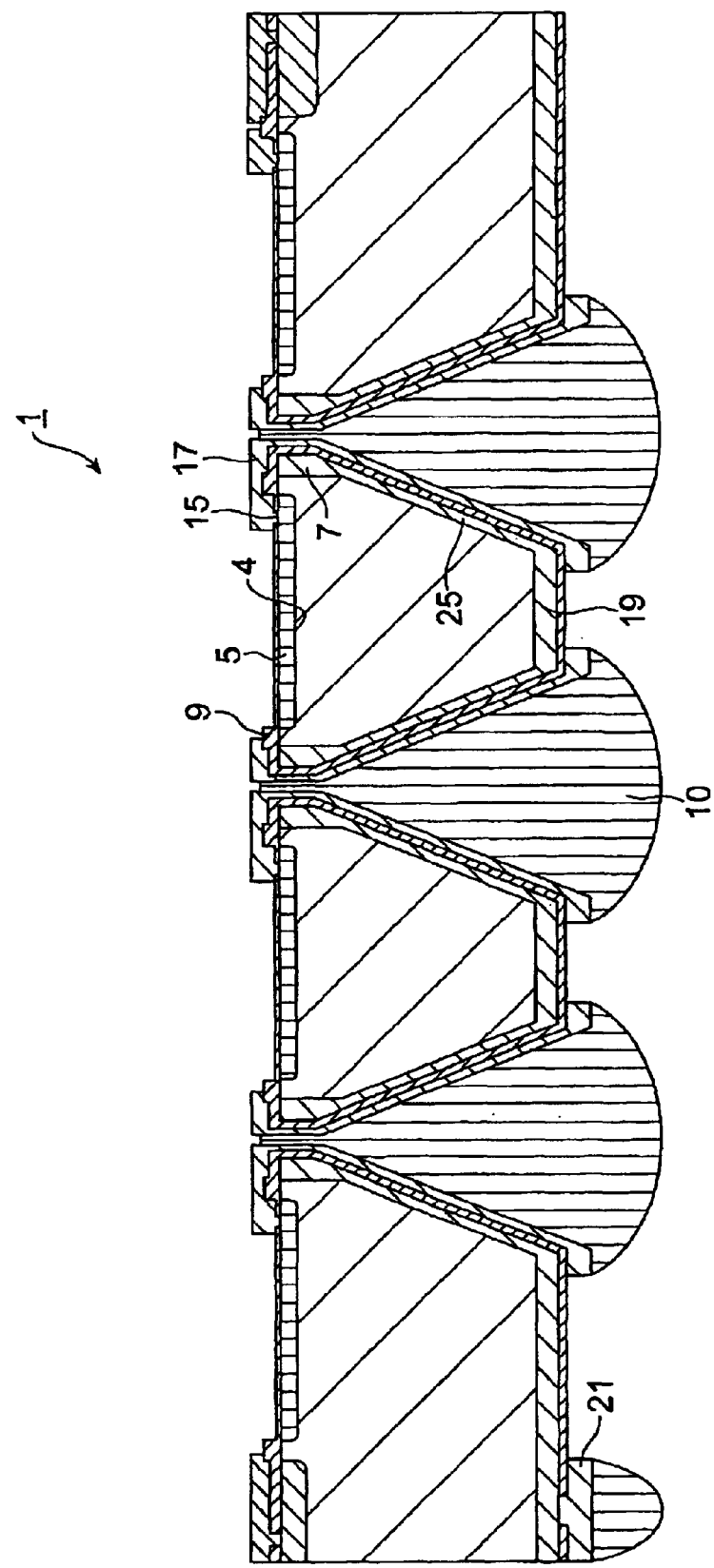
FIG. 6 is a sectional view of a photodiode array.

FIG. 6 is a sectional view of a photodiode array.

The through hole 12 may be completely filled with a conductive material 10. The filling electrically conductive material not only improves the mechanical strength of the photodiode array 1, but may be used as a bump electrode as it is when projected in a hemispherical form from the hem of the second hole part 13 on the rear side. The electrically conductive material 10 maybe solder, electrically conductive resins including electrically conductive fillers, and the like.

A method of making the photodiode array will now be explained.

In the following, a method of making the photodiode array whose through holes 12 are filled with a polyimide resin (see FIG. 5) will be explained.

Figure 7:
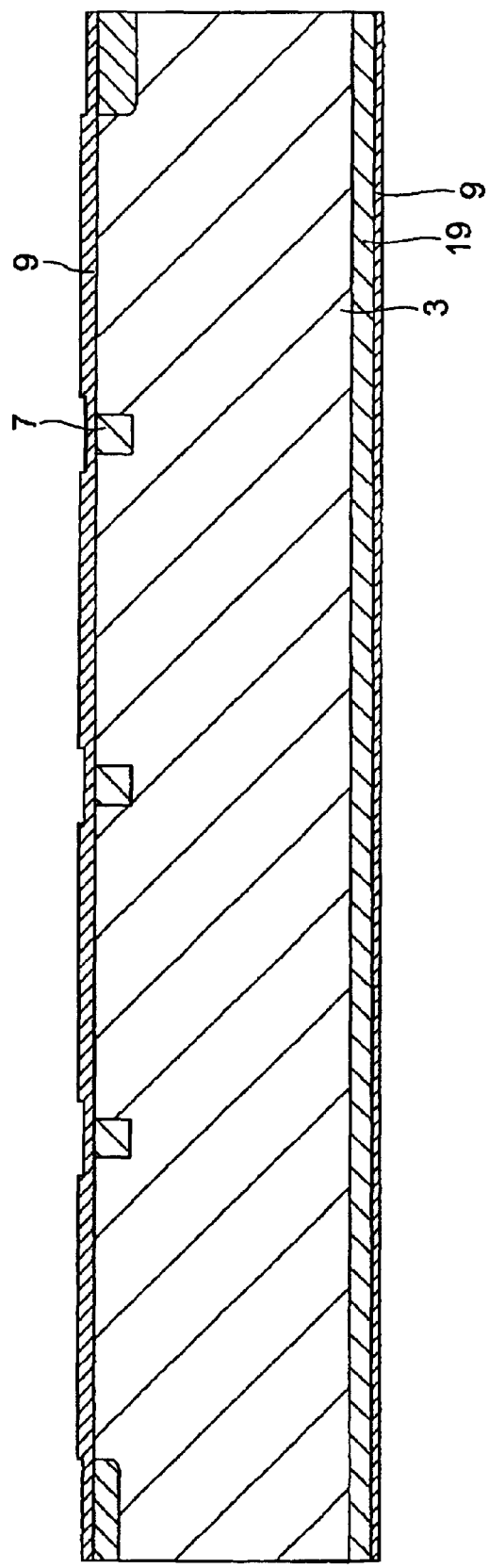
FIG. 7 is a sectional view of a photodiode array for explaining a manufacturing step thereof.

FIG. 7 is a sectional view of a photodiode array for explaining a manufacturing step thereof.

First, an n-type semiconductor (100) substrate 3 is prepared. The front side of the substrate is thermally oxidized, and a thermally oxidized layer 9, which is utilized as a mask for $n^+$ thermal diffusion in the next step, is formed. At positions to become separation layers 7, the thermally oxidized film is bored by a photoetching process, and phosphorus is thermally diffused and thermally oxidized. Here, phosphorus is also diffused over the whole area of the rear side, whereby an $n^+$-type impurity concentration layer 19 is formed.

Figure 8:
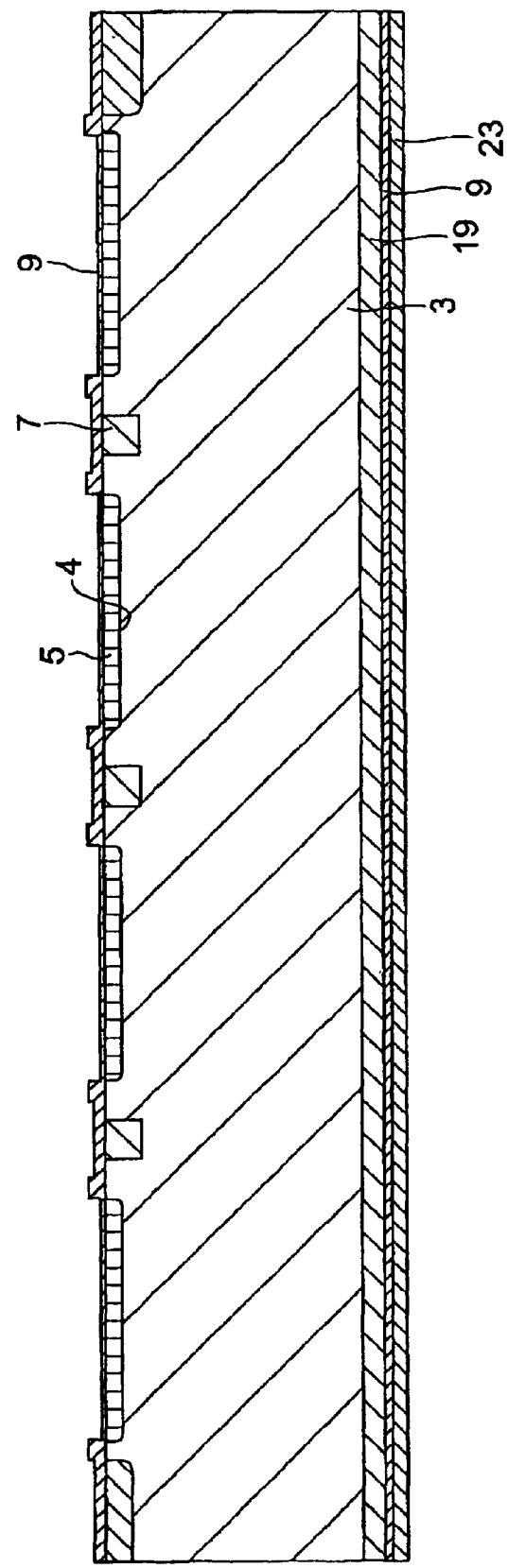
FIG. 8 is a sectional view of the photodiode array for explaining a manufacturing step thereof.

FIG. 8 is a sectional view of a photodiode array for explaining a manufacturing step thereof.

The thermally oxidizing layer is similarly bored at areas for forming pn junctions 4, and boron is thermally diffused and thermally oxidized. The areas of pn junctions 4 become parts corresponding to photosensitive pixels. A silicon nitride film (SiNx) 23 and the thermally oxidized layer 9 is formed on the rear side by plasma CVD or LP-CVD (see FIG. 8), and is eliminated by etching from areas for forming second hole parts 13. The areas for forming the second hole parts 13 are located at positions corresponding to the separation layers 7 on the rear side.

Here, the areas for eliminating the silicon nitride film 23 and the thermally oxidized layer 9 have been designed beforehand so as to have such forms and sizes that the vertices of quadrangular pyramids of second hole parts 13 do not reach the front side upon alkali etching, which will be explained later, and are located at positions corresponding to the separation layers 7 on the front side.

Figure 9:
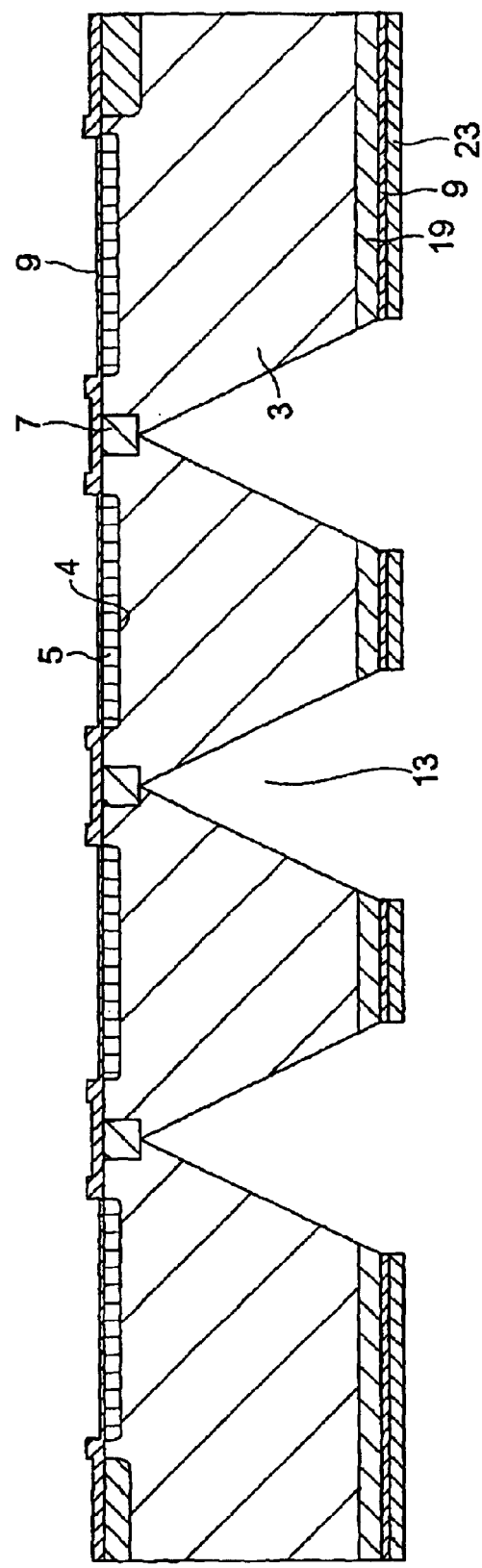
FIG. 9 is a sectional view of the photodiode array for explaining a manufacturing step thereof.

FIG. 9 is a sectional view of the photodiode array for explaining a manufacturing step thereof.

The semiconductor substrate 3 is subjected to anisotropic etching with an alkali (e.g., potassium hydroxide solution, TMAH, hydrazine, or EDP) from the rear side, so as to form the second hole parts 13. Namely, the substrate is etched from the crystal plane (100), so as to expose the (111) plane. Each second hole part 13 is formed like a quadrangular pyramid by etching, whereas the etching automatically stops at the vertex of the quadrangular pyramid (see FIG. 9.

Etching may be stopped before reaching the vertex of the quadrangular pyramid as well. Next, the parts corresponding to the vertices of thus formed quadrangular pyramids are dry-etched from the front side, so as to form first hole parts 11, which are further etched until they connect with the vertices of quadrangular pyramids of second hole parts 13, so as to form through holes 12 constituted by the first hole parts 11 and second hole parts 13.

Figure 10:
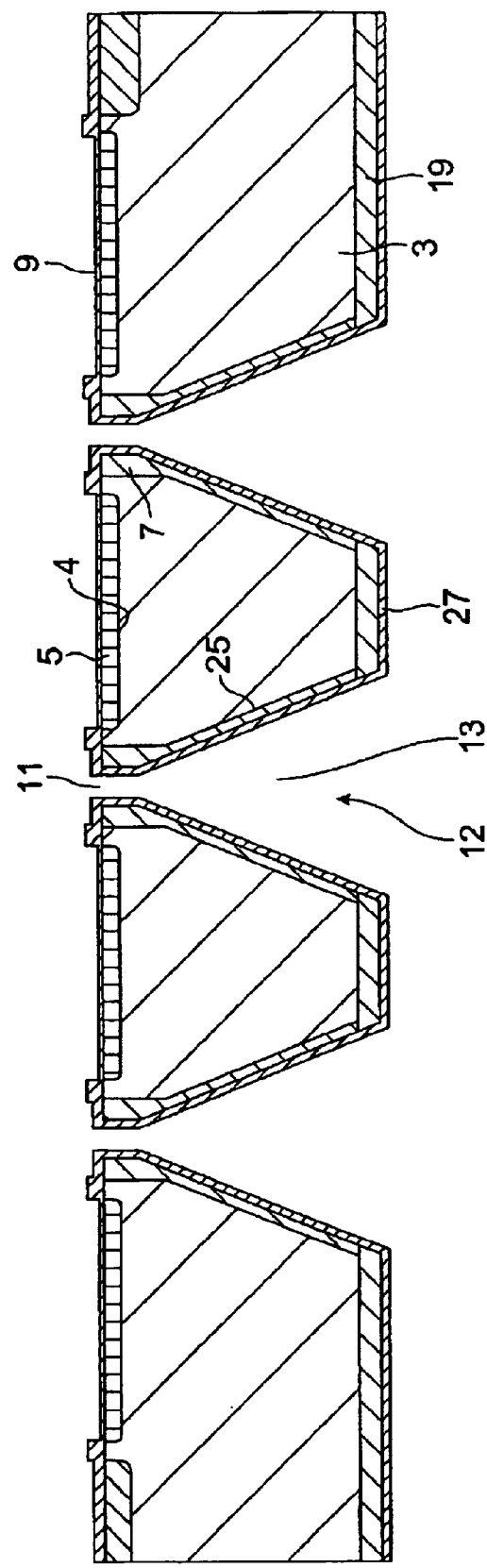
FIG. 10 is a sectional view of the photodiode array for explaining a manufacturing step thereof.

FIG. 10 is a sectional view of the photodiode array for explaining a manufacturing step thereof.

The $n^+$ layers 25 surrounding their corresponding through holes 12 are formed by ion implantations or diffusions from the rear side. The $n^+$ layers 25 connect with the separation layers 7 and the $n^+$-type impurity concentration layers 19 on the rear side. Thereafter, for securing insulation of side walls, $SiO_2$ layers 27 are formed by thermal oxidation (see FIG. 10). The insulating layers for side walls may be not only the $SiO_2$ layers 27, but also laminate films with SiNx, $SiO_2$ films formed by CVD, and the like.

Next, $p^+$ and $n^+$ layers are provided with contact holes 15, and for forming through holes wirings 17, aluminum is deposited from both sides by a sputtering apparatus. Then, with a resist formed thereon, a desirable pattern is formed by etching. The material for the through hole wirings 17 is not limited to aluminum, whereas the method of forming the wirings is not limited to sputtering. For example, a polysilicon part formed by CVD may be subjected to diffusion for lowering the electric resistance. In this case, only the contact hole parts may be made of aluminum and electrically connected to the polysilicon part.

Figure 11:
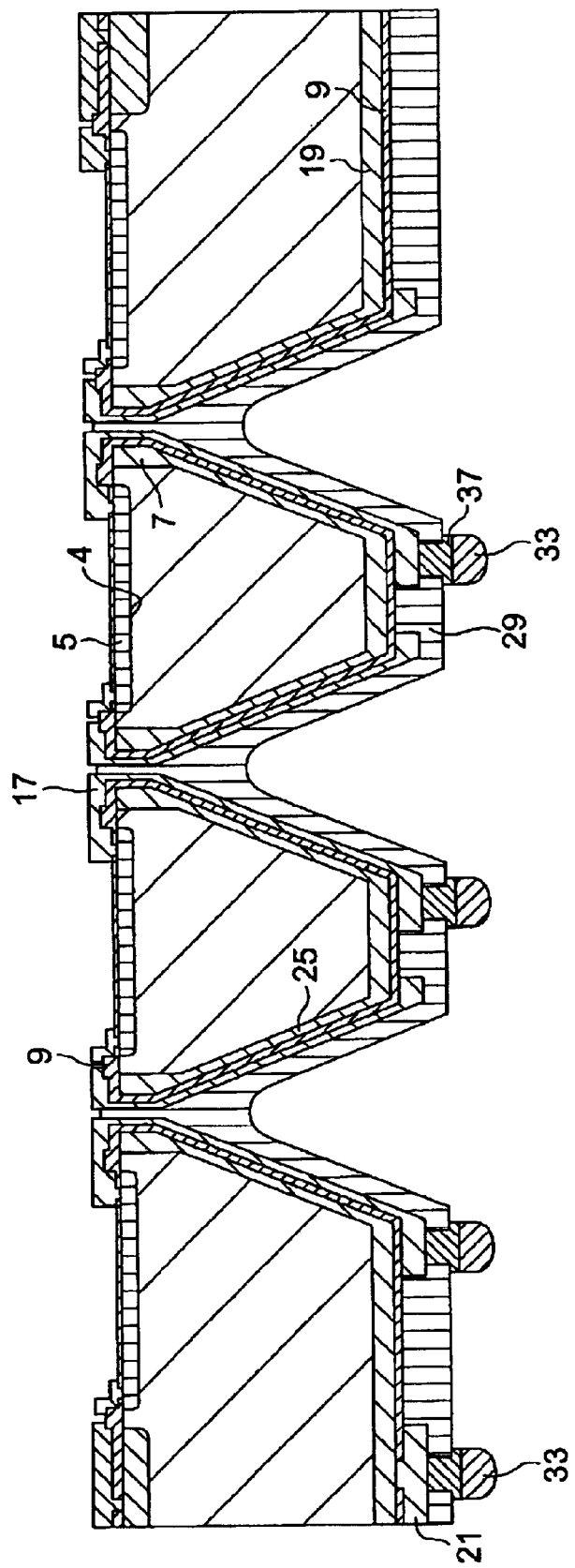
FIG. 11 is a sectional view of the photodiode array for explaining a manufacturing step thereof.

FIG. 11 is a sectional view of the photodiode array for explaining a manufacturing step thereof.

A photosensitive polyimide layer 29 is formed on the rear side, and is bored only at locations where bump electrodes 33 are to be disposed and is bored at the $n^+$ electrode locations, one of the bump 33 is provided on the $n^+$ electrodes 21. Then, the bump electrodes 33 are formed by way of under bump metal 37 (hereinafter referred to as "UBM") parts formed by a metal establishing an electrically/physically excellent connection to the bump electrodes 33. When the bump electrodes 33 are solder bumps, for example, wettable metal parts should be formed between solder and aluminum, since solder is not wettable with aluminum. The UBM parts in this case can be realized by forming Ni—Au by electroless plating or forming Ti—Pt—Au or Cr—Au by lift-off procedure.

An acrylic layer, an epoxy layer, and a layer of a composite material including them may also be used in place of the polyimide layer. The solder bumps can be formed by disposing solder at predetermined UBM parts by a solder ball mounting method or a printing method, and then causing thus disposed solder to reflow. The bump electrodes 33 are not limited to solder bumps, but may be electrically conductive bumps including metals such as gold bumps, nickel bumps, copper bumps, and conductive resin bumps.

Figure 12:
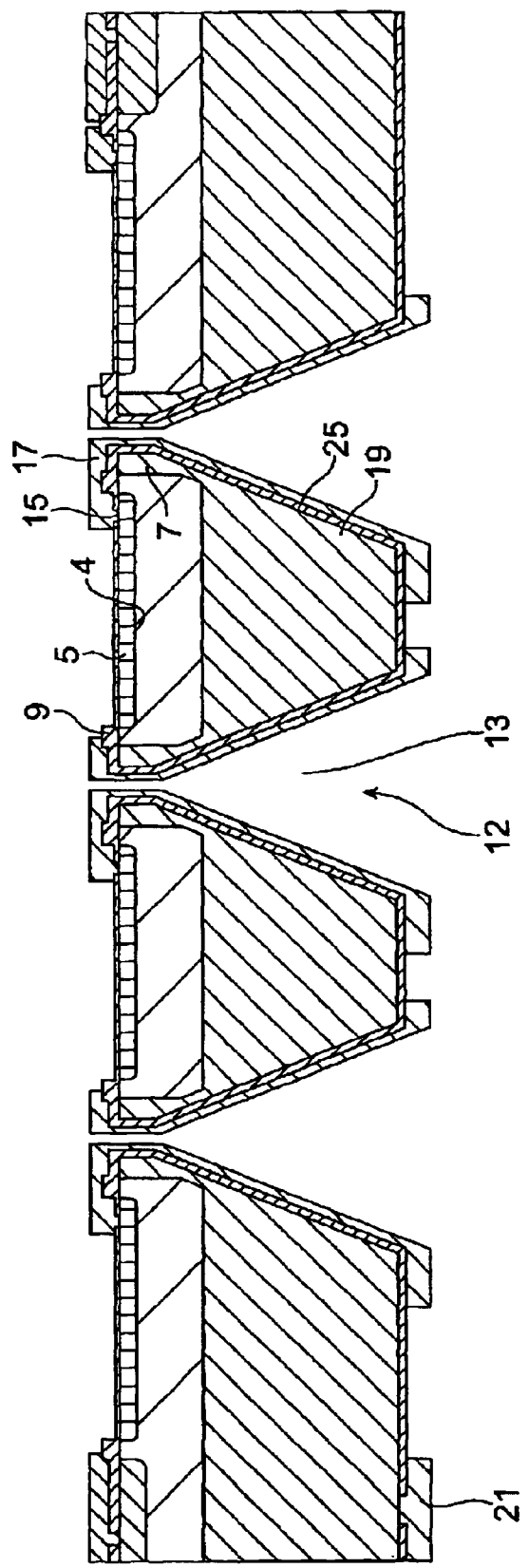
FIG. 12 is a sectional view of a photodiode array.

FIG. 12 is a sectional view of a photodiode array.

Though the n-type semiconductor substrate is initially prepared, and an $n^+$-type impurity concentration layer is formed by thermal diffusion in the above-mentioned method, an n-type semiconductor substrate provided with an $n^+$-type impurity concentration layer beforehand by thermal diffusion or epitaxial growth may be prepared as shown in FIG. 12. This can increase the thickness of the $n^+$-type impurity concentration layer in the photodiode array, so that the distance between the substantially p-type impurity diffusion layer 5 and the $n^+$-type impurity concentration layer 19 can be short. As a consequence, the resistance component can be reduced, whereby the response can be fast.

Also, regulating the distance between the substantially p-type impurity diffusion layer 5 and the $n^+$-type impurity concentration layer 19 can yield spectral sensitivity curve characteristics conforming to given specifications.

Effects of the above-mentioned photodiode array and method of making the same will now be explained.

In the above-mentioned photodiode array, the second hole parts 13 are initially formed by alkali etching from the rear side, and then the first hole parts 11 are formed, whereby the through holes 12 are formed. Thus, the through holes are not completed at the time of alkali etching step, whereby no erosion toward the front side is caused by alkali etching. Since the photosensitive surface is not adversely affected in particular, the yield can be prevented from decreasing.

In the alkali etching step, the etching is stopped when each second hole part 13 is etched to the vertex of its quadrangular pyramid. Thus, there is no need for separately providing an etching stop layer or the like. Since a major part (second hole part 13) of each through hole 12 is formed by anisotropic etching, unevenness is smaller in the wall surface, whereby the smooth wall surface can be obtained in the through hole. Therefore, unnecessary carriers are restrained from occurring because of damages in the wall surface of the through hole, whereby dark currents can be reduced.

Figure 13A:
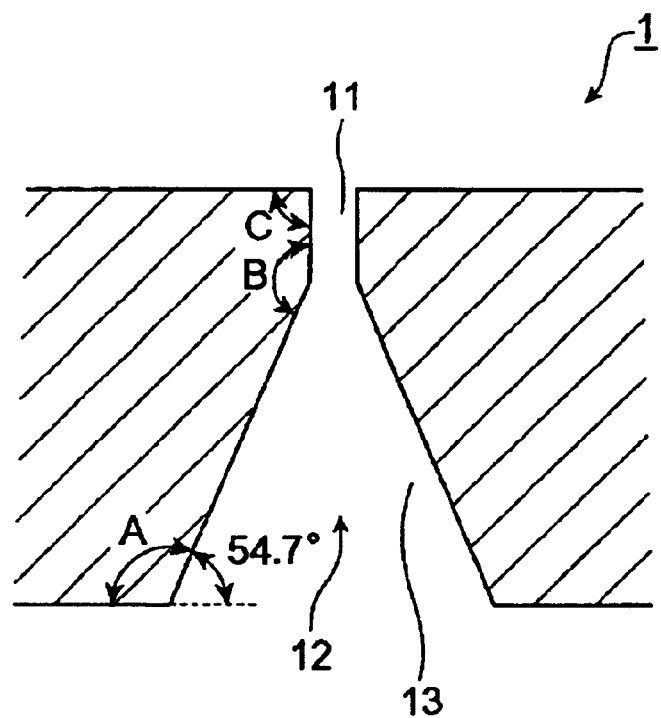
FIG. 13A is a sectional view of a through hole part in a photodiode array.
Figure 13B:
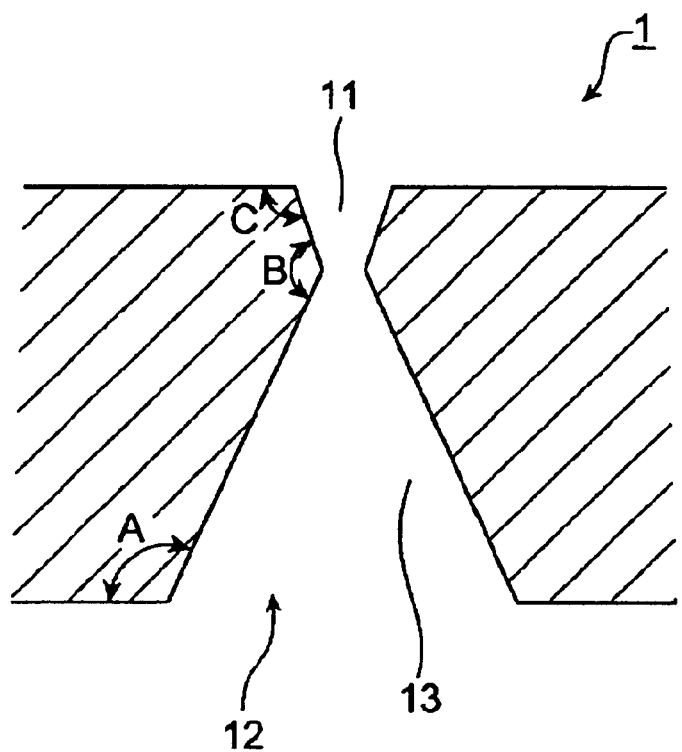
FIG. 13B is a sectional view of a through hole part in a photodiode array.

FIGS. 13A and 13B are sectional views of a through hole part in a photodiode array.

The wall surface of the second hole part 13 forms an angle of 54.7° with respect to the surface of the photodiode array, whereas the wall surface of the first hole part 11 is substantially perpendicular to the surface.

When a through hole is formed by the second hole part 13 alone by using alkali etching, the second hole part and the front side of the photodiode array directly connect with each other, whereby the angle θ formed between their surfaces becomes acute.

In the photodiode array shown in FIG. 13A, by contrast, the through hole 12 is formed by connecting two hole parts to each other, whereby the angle B formed at their junction is 90° or greater. Further, the angle A formed between the second hole part 13 and the rear side of the photodiode is 90° or greater, whereas the angle C formed between the first hole part 11 and the front side of the photodiode is about 90°.

Therefore, the through hole wiring 17 extending from the front side to the rear side by way of the through hole 12 has no part bent by an acute angle, and thus can restrain conduction from failing because of insufficient coverage at the time of forming. Further, depending on the dry-etching condition at the time of making the first hole part 11, the first hole part 11 may be tapered, so as to form an angle C of 90° or greater as shown in FIG. 13B. This can further restrain conduction from failing.

Since the second hole part 13 in the photodiode array is formed by alkali etching dopant, ions can be implanted into the wall surface of the through hole 12, whereby the $n^+$ layer 25 can easily be formed by ion implantation. Thus formed $n^+$ layer 25 acts as a separation layer for separating the photodiodes from each other, and traps unnecessary carriers so as to reduce dark currents.

In the photodiode array, the first hole part 11 is formed so as to penetrate through the separation layer 7. Therefore, even when the inner wall of the first hole part 11 is damaged and so forth at the time of dry etching for forming the hole part, generated unnecessary carriers are trapped by the separation layer 7. Hence, the photodiode array can prevent leak currents and the like from occurring because of damages when forming through hole wirings.

As explained in the foregoing, the present invention can provide a photodiode array which is less likely to cause conduction failures in through hole wirings, while yielding a high fill factor.

What is claimed is:

1. A photodiode array comprising a semiconductor substrate of a first conduction type formed with an array of a plurality of pn junction type photodiodes on an incident surface side for light to be detected, the surface opposite from the incident surface in the semiconductor substrate being made of a (100) plane; the semiconductor substrate having a through hole, formed in an area held between the photodiodes, penetrating through the semiconductor substrate from the incident surface side to the opposite surface side;

the photodiode array comprising a conductive layer extending from the incident surface to the opposite surface by way of a wall surface of the through hole;

the through hole comprising:

a vertical hole part formed substantially perpendicular to the incident surface on the incident surface side, and a pyramidal hole part formed like a quadrangular pyramid on the opposite surface side;

the vertical hole part and pyramidal hole part being connected to each other within the semiconductor substrate, the pyramidal hole part having a wall surface formed as a (111) plane.

2. A photodiode array according to claim 1, further comprising a high impurity concentration layer of the first conduction type surrounding the through hole within the semiconductor substrate.

* * * * *